United States Patent
Ni

(10) Patent No.: US 6,200,387 B1
(45) Date of Patent: Mar. 13, 2001

(54) METHOD AND SYSTEM FOR PROCESSING SUBSTRATES USING NEBULIZED CHEMICALS CREATED BY HEATED CHEMICAL GASES

(76) Inventor: Dangsheng P. E. Ni, 1212 New Hampshire La., Downingtown, PA (US) 19335

(*) Notice: Subject to any disclaimer, the term of this patent is extended or adjusted under 35 U.S.C. 154(b) by 0 days.

(21) Appl. No.: 09/182,592

(22) Filed: Oct. 30, 1998

(51) Int. Cl.[7] .................................................. C23C 16/00
(52) U.S. Cl. ............................ 118/722; 239/8; 239/10; 239/338; 239/339; 118/715; 118/722
(58) Field of Search .................. 239/338, 8, 10, 239/339; 118/724, 715, 722

(56) References Cited

U.S. PATENT DOCUMENTS

| | | | | |
|---|---|---|---|---|
| 4,690,332 | * | 9/1987 | Hughes | 239/338 |
| 4,917,830 | * | 4/1990 | Ortiz et al. | 261/18.1 |
| 4,920,918 | * | 5/1990 | Adams et al. | 118/724 |
| 5,170,782 | * | 12/1992 | Kocinski | 128/200.16 |
| 5,272,308 | * | 12/1993 | Wiederin | 219/121.52 |

* cited by examiner

Primary Examiner—Deborah Jones
Assistant Examiner—Lymarie Miranda
(74) Attorney, Agent, or Firm—Norman St Landau

(57) ABSTRACT

Invented is a method and system for wet processing substrates (especially for semiconductor wafers and flat panel displays) using nebulized chemicals created and carried by heated chemical gases. Different heated nebulized process chemicals are sequentially pressurized into a process chamber based on various process recipes. The micro nebulized chemicals would penetrate the intricate topologies on the substrates with heated and pressurized energy, and form a process effective thin film on each substrate. The process chamber is made of a material that is well compatible to all process chemicals and gases. It is designed to have the capability of circulating the flow of nebulized chemicals and gases to uniformly treat the inside substrates. The chamber is also designed having minimum open space to save process chemicals and deionized (DI) water. The method and system would result in significant less consumption of the process chemicals and rinse DI water without compromising the importance of minimizing process contamination and substrate surface damage, increasing process uniformity and throughput.

2 Claims, 5 Drawing Sheets

METHOD AND SYSTEM FOR PROCESSING SUBSTRATES USING NEBULIZED CHEMICALS CREATED BY HEATED CHEMICAL GASES

BACKGROUND OF THE INVENTION

1. Field of the Invention

The present invention relates to a method and system is invented for substrates chemical treatment and more particularly for semiconductor wafers and flat panel displays (FPD) wet processing.

2. Description of the Prior Art

Methods and systems are invented for substrates and more particularly for semiconductor wafers and flat panel displays (FPD) chemical treatment using nebulized chemicals created and carried by heated chemical gases. A nebulizer and a process chamber with novel invented design features have been provided in the prior art that are adapted to be used. Even though these innovations may be suitable for the specific individual purposes to which they address, they would not be suitable for the purposes of the present invention as heretofore described.

SUMMARY OF THE INVENTION

This method and system is invented for substrates chemical treatment and more particularly for semiconductor wafers and flat panel displays (FPD) wet processing.

The wet chemical process has been key semiconductor processing technologies since the beginning of these products fabrication. It serves both to remove micro metal and none metal contaminants introduced by any previous processing steps and to prepare an optimum surface for the next processing step. It accounts for more than thirty percent (30%) of the total VLSI (very larger scale integrated circuit) manufacturing steps. Improper wet processing can cause substrate surface damage, circuit failure, huge process chemicals and deionized water usage, which negatively effect the product yield.

The most popular wet processing chemical is still the hydrogen peroxide ($H_2O_2$) based RCA Standard Clean which consists of SC-1 (ammonium hydroxide $NH_4OH$/hydrogen peroxide $H_2O_2$/DI water $H_2O$ mixture) and SC-2 (hydrochloric acid HCL/hydrogen peroxide $H_2O_2$/DI water $H_2O$ mixture) clean. SC-1 is used for light organic particle removal and SC-2 is used for metal particle removal. Other popular wet processing chemicals are SPM (sulfuric acid $H_2SO_4$/hydrogen peroxide $H_2O_2$) and SOM (sulfuric acid $H_2SO_4$/ozone gas $O_2$) clean. Both SPM and SOM are mainly used to remove heavy organic contaminants. Other modified and alternative processing chemicals are being proposed and used. For examples, people use liquid hydrogen peroxide ($H_2O_2$) added liquid hydrofluoric (HF) to prevent copper adhesion to the silicon surface. Ozonated water ($O_2$—$H_2O$) to replace the SPM or SOM clean, etc.

Currently available prevalent wet processing method and equipment include bench processing (using different liquid chemical baths), single vessel processing (different liquid chemicals passing through the vessel), and centrifugal spray processing (different liquid chemicals spraying to substrates in a rotating chamber).

In the wet bench processing, wafers or FPD are processed and moved through a series of different liquid process chemical and rinse DI water bathes. Its main shortage is using most complicated automation controls, chemical pH value and filtration control. It also consumes most chemicals, rinse DI water and bigger footprint compare to other processing technologies. In the single vessel wet processing, wafers or FPD stay in a processing vessel (or bath) and different liquid process chemicals and rinse DI water sequentially flow through the vessel. It has smaller footprint, but it still uses considerable chemicals and rinse DI water (even less compare to the wet bench). In the centrifugal spray processing, wafers or FPD are rotating in a processing chamber while process liquid chemicals and rinse DI water sequentially spray onto the substrates. It also has smaller footprint but it uses more complicated chamber rotating mechanism and control.

Other wet processing technologies are also used in semiconductor wafer and flat panel displays (FPD) clean process, for example, very higher pressure (2000–3000 psig) liquid process chemical and rinse DI water jet clean, hydrophilic fiber scrubbing clean, etc. They are mainly used for post CMP (chemical mechanical polish) clean for wafers and single substrate processing for FPD. The shortage of higher pressure liquid jet clean is to generate higher stress inside the substrates, and the scrubbing clean could scratch the surface of the substrates.

As semiconductor wafer and flat panel display (FPD) keeps shifting toward larger sizes, companies, scientists and engineers in these industries become more concerned to the Cost Of Ownership (COO) to the processing equipment and technologies. In other words, they are more care of the process dollar cost per substrate (wafer or FPD). In the wet processing area, the rinse DI water and liquid chemical cost counts the most percentage in any cost of ownership (COO) analysis. Cordon D. Ching and Robert B. Murtha from Intel disclosed in their COO study paper that DI water is the highest cost (32%) and liquid chemicals is the third cost (16%) in an entire 200 mm diameter wafer wet process. The capital equipment cost is the second (23%). Reducing DI water and chemical consumption would be a tremendous benefit not only to the cost of ownership (COO), but also to the more heightened environment these days.

People have been looking for new process methods and technologies to reduce the COO without compromising the importance of minimizing contamination, increasing uniformity and throughput. The dry (vapor or gas) cleaning which use much more less chemicals was proposed and developed to replace certain wet processes (wet processes has been largely replaced by plasma etching) as the permissible concentrations of contaminants scale down with the increasing density of IC (integrated circuit). But such clean processes can only remove specific types of contaminants, but also leave some particles and metallic contaminants from the dry process. They may also cause some substrates surface damages with ultraviolet excited or plasma-assisted dry cleaning. The dry cleaning process doesn't have certain particle removal results which wet process cleaning phase, since it can not use certain well developed cleaning chemical mixtures since they do not exist in their vapor or gas phase (for example SC-1, $NH_2OH+H_2O_2+H_2O$) mixtures). Thus, the wet chemical processing technologies will continue to be the dominant technologies for years to come in the industries.

Accordingly there is a need for a new method and system which will satisfy the continuing improvements in performance and cost effectiveness both in the wet process technologies and equipment designs. The present invention can meet the need. The main object of the invention is to design a new wet process method and system with minimum chemical and DI water consumption, minimum waste chemical disposal, and simple equipment structure.

The method and system would also be used for numerous processes in the substrates (wafer and FPD) fabrication, like nebulized chemical deposition (NCD), nebulized photo resistor coating (NPC), nebulized chemical platting (NCP), etc.

According to the embodiment of the present invention, a method and system for treating substrates is provided. It uses nebulized chemicals created and carried by heated chemical gases to treat the substrates.

The substrates to be processed will be loaded into the carrier section of the process chamber by a robot (it is preferred to use the robot, but they can also be loaded manually, or semi-automatically). The loaded chamber carrier section will be transferred by automation into the system. Then the lid and bottom section of the process chamber will be sealed together with the carried section by a mechanical structure.

Based on each process requirement, an inert gas said nitrogen ($N_2$) with preset temperature control flow into the process chamber first for the substrate temperature conditioning, then different heated and pressurized nebulized chemicals are bringing into the process chamber and circulating inside. The micro nebulized chemicals would penetrate the intricate topologies on the substrates with heated and pressurized energy, they will form a chemical process effective thin film on each substrate.

Those chemicals are heated before they are going to be nebulized. Some higher viscosity chemicals will reduce its viscosity greatly by the heating process, which will be easier to be nebulized.

After each nebulized chemical processing, quick brief down flow DI water rinses with meg-sonic energy and heated nitrogen ($N_2$)-conditioning step are followed. The rinse time will be significantly less compare to other existing wet process technologies, since it only need to rinse far less residue process chemicals on the substrates and inside wall of the process chamber.

Final DI water through rinse with down stream meg-sonic energy is needed after all predetermined process. The following step is to bring nebulized organic solvent said isopropyl alcohol (IPA) created by heated inert gas said nitrogen ($N_2$) into the process chamber. The heated nebulized IPA has less surface tension compared to the cold one, much more less surface tension compared to the rinse DI water, and it is safer to use compared to the superheated IPA vapor. The pressurized nebulized IPA will form a thin film on surface of the rinse DI water, and push most water and some residue particles away from the substrates by its lower surface tension characteristic force. The final step is to purge and dry the substrates and the process chamber by heated nitrogen ($N_2$).

Then, the process chamber will be unsealed by a mechanical structure, and the processed dry substrates will be unloaded from the carrier section of the chamber for next possible process.

The invention also consists of a nebulizer design, which can generate fine micro nebulized chemicals with a function of collecting of condensed chemicals. Based on different process recipes, different pre ratio mixed chemicals (ex. SC-1) are nebulized by different chemical gases (ex $N_2$). As the lower pressure chemicals said at 1–10 psig meet higher-pressure chemical gases said at 10–20 psig, they will be broken into small particles. Those small particles will impact on the resonator wall of the nebulizer with high velocity, then shattered into smaller particles said less than 10 microns. The pressures of corresponding process chemicals and gases control the nebulized chemicals flow rate. The exit path of the nebulizer is designed to be long and vertical, and most condensed chemicals flow back by the gravity to a chemical container for further reuse or reclaim.

One important object of this invention is to use different chemical gases to nebulize the different liquid chemicals for the substrates process. The method not only significantly save processes chemicals and DI water, but also gives tremendous process flexibility in the industries. The embodiment of invention includes but not limited the following process:

Use heated ozone ($O_3$) gas to nebulize the DI water ($H_2O$) for substrate general particle removal and photo-resistor stripping.

Use heated hydrofluoric (HF) gas to nebulize the hydrogen peroxide ($H_2O_2$) to prevent particle adhesion to the substrate.

Use heated hydrofluoric (HF) gas to nebulize the DI water ($H_2O$) for metallic and native oxide particle removal.

Use heated positive electrical charged nitrogen ($N_2$) gas to nebulize a platting chemical solution for platting negative electrical charged substrates.

Use heated nitrogen ($N_2$) gas to nebulize heated photo-resistor solution for substrates coating process.

The embodiment of the invention also includes the design of the process chamber. The process chamber would be made of a material that is well compatible to all process chemicals and gases. The nebulized chemicals are brought into the process chamber from the side (not center) valves along the circular shaped wall inside the chamber which helps the nebulized chemicals and gases uniformly circulating. The process chamber is made of three parts, which are chamber lid, chamber substrates carrier, and chamber bottom. They are gases tight sealed together during the entire process. The number of the bank of chemical process values, which connected to the top lid, is determined by number of substrates inside the chamber, which insure the nebulized chemicals quickly and uniformly contact the substrates surface. There is a couple of meg-sonic transducers mounted inside the lid, which will be energized during the process rinse time. The substrate carrier section of the process chamber is made of U-shaped, which can hold the substrates steadily without any support bar underneath or additional substrate carrier, which increase the efficiency of the rinse process and save the chemical and DI water usage. There is a bank of valves located at the bottom section of the process chamber, which serve for draining and venting purpose. The chamber is designed having O-shaped cross-section for circular shaped substrates, and it would be long ellipse-shaped cross section for square-shaped substrates. The configuration of the process chamber is well designed having minimum open space to save process chemicals and rinse (DI) water, which ultimately saves the process time and increase the product yield.

The novel features which are considered characteristic for the invention are set forth in the appended claims. The invention itself, however, both as to its construction and its method of operation, together with additional objects and advantages thereof, will be best understood from the following description of the specific embodiments when read and understood in connection with the accompanying drawings.

List of Reference Numerals Utilized in the Drawings

110—substrates (110)
111—O-shaped process chamber (111)

112—dividing groove (112)
113—pressure transducer (113)
114—drain valve (114)
115—venting valve (115)
116—vacuum pump (116)
117—valve (117)
118—three-way process valve (118)
120—meg-sonic transducers (120)
200—chemical manifold (200)
221—valve manifold (221)
222—pressure regulator (222)
224—gas heater (224)
225—gas filer (225)
226—temperature sensor thermal couple (226)
227—chemical mixture container (227)
228—control valve (228)
229—metering pump (229)
230—process heater (230)
231—sensor thermocouple (231)
232—pressure regulator (232)
233—gas flow mass controller (233)
234—pressure sensor (234)
235—venting valve (235)
236—nitrogen (236)
237—nebulizer (237)
238—control valve (238)
239—filter (239)
240—control valve (240)
241—resonator wall (241)
242—vertical path (242)
243—valve (243)
244—valve (244)
245—valve (245)
246—chemical gas (246)
247—regulator (247)
248—control valve (248)
249—chemical container (249)
250—valve (250)
300—port (300)
301—port (301)
302—intersection (302)
303—cross O-shaped openings (303)
401—step (401)
402—step (402)
403—step (403)
404—step (404)
405—step (405)
406—step (406)
407—step (407)
408—step (408)
409—step (409)
410—step (410)
501—lid section (501)
502—carrier section (502)
503—bottom section (503)
504—lower section (504)
505—O-ring (505)
506—O-ring (506)
507—O-shaped wall (507)

DESCRIPTION OF THE PREFERRED EMBODIMENT

Figure 1A:
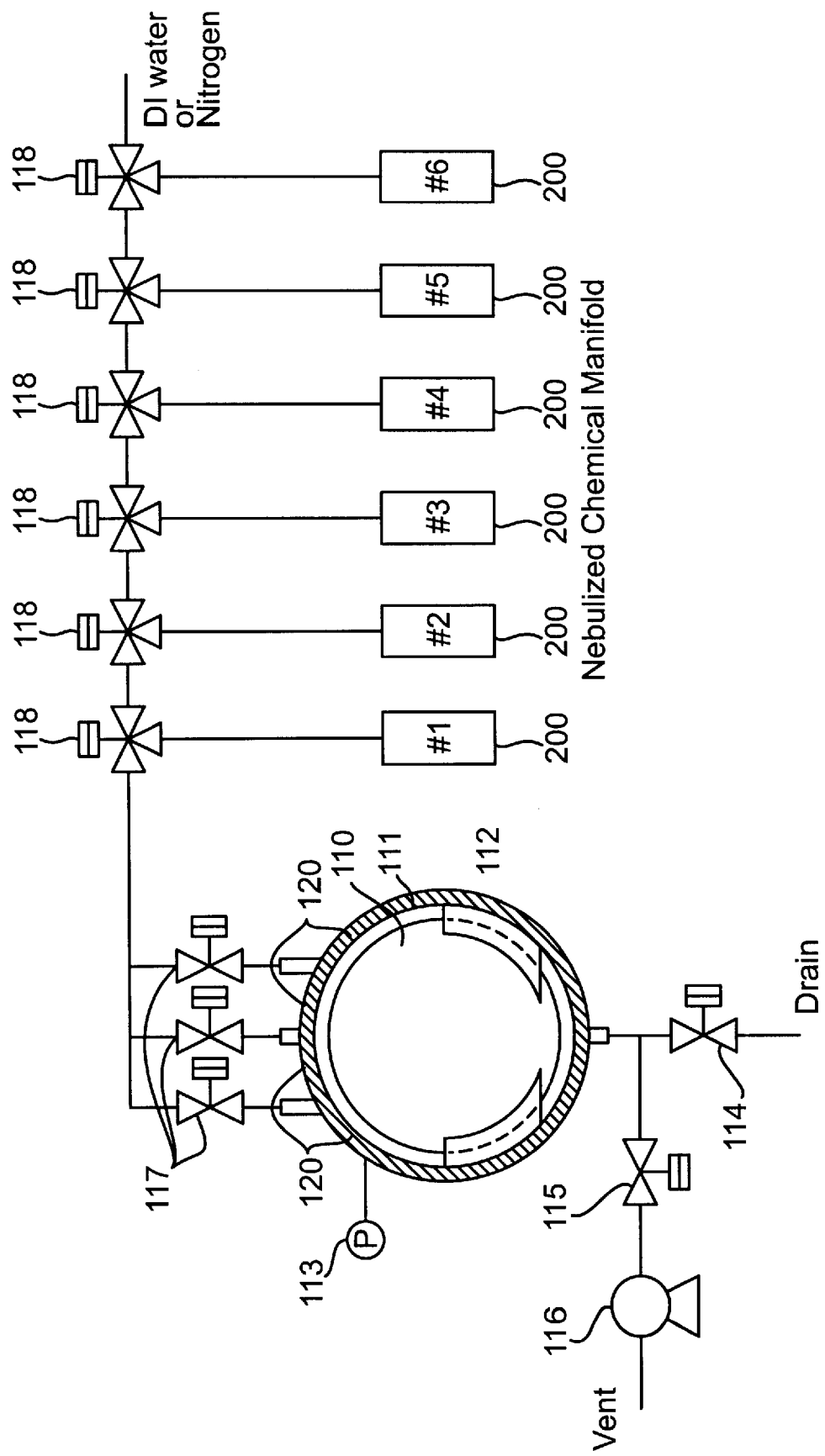
FIG. 1A is a schematic diagram illustrates the method and system of the present invention.

Referring to FIG. 1A illustrates general configuration of the current invented method and system. An O-shaped process chamber (111) (it would be ellipse-shaped for square substrates), that contains to be processed substrates (110) (shown wafer in the drawing, it could be FPD). A set of dividing grooves (112) prevent the substrates align each other. The nebulized process chemicals are pressurized into the chamber through a bank of valves (117). A pressure transducer (113) is used to monitor the process pressure, and feed back its electrical analog signals to the computerized system controller (well known in the art and not shown in the drawing). The vacuum pump (116) and the venting valve (115) are controlled according to the process pressure inside the process chamber. The bank of valve (117) located on the top also serves the entry function for rinse DI water and process nitrogen ($N_2$). A bank of drain valves (114) is located at the bottom of the process chamber, which will be connected to process drain.

A couple of meg-sonic transducers (120) are mounted on the top of the process chamber, which are energized during the process rinse time.

A set of three-way process valves (118) are controlled by computerized system controller. Based on process requirement, different nebulized process chemicals are brought into the process chamber through the three-way process valves (118) from different nebulized process chemical manifold (200). The number of those three-way process valves (118) and the number of the nebulized process chemical manifolds (200) are determined by customer process requirement.

Figure 1B:
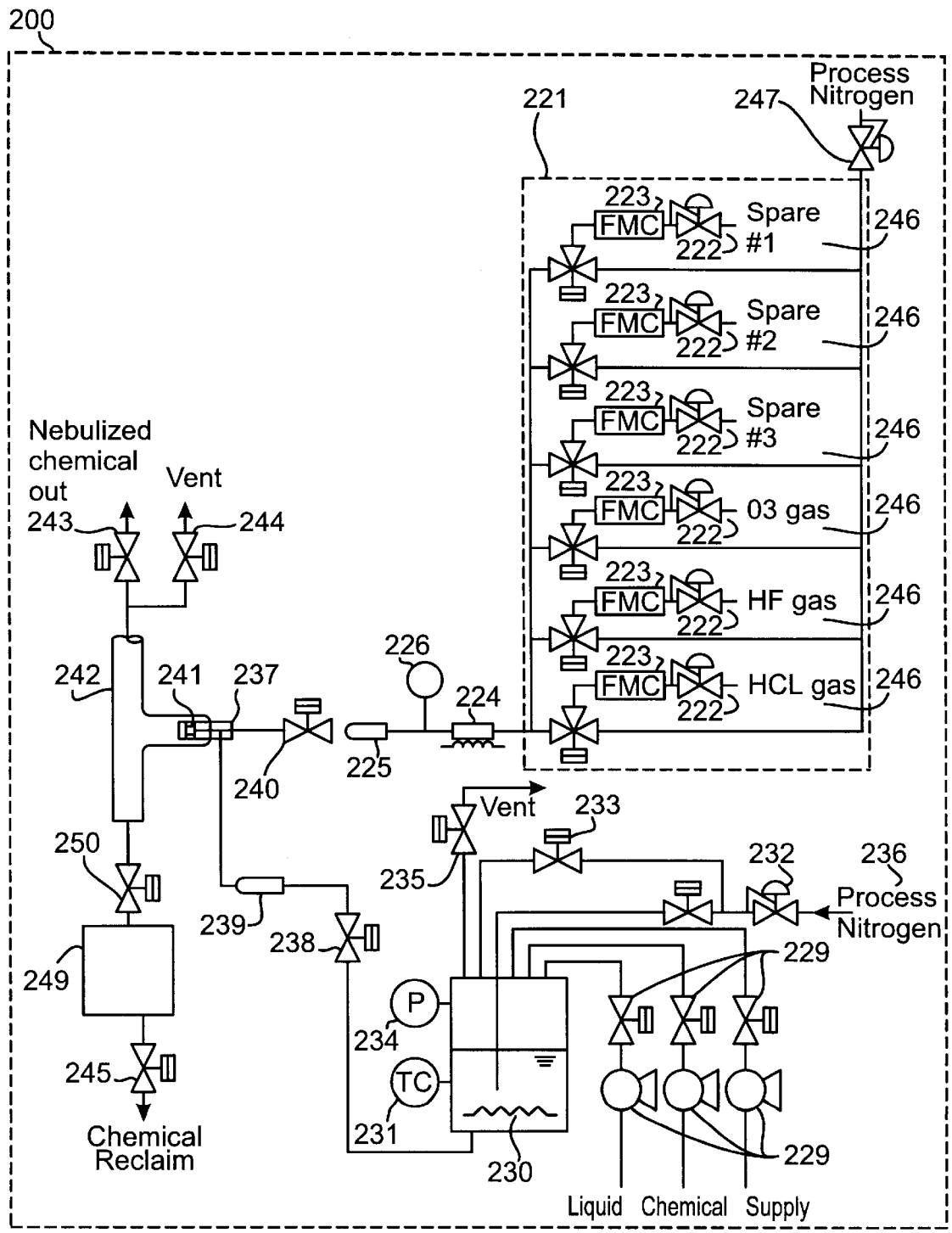
FIG. 1B is a schematic diagram illustrates the method and system of the present invention.

Now, referring to FIG. 1B illustrates general configuration of the nebulized process chemical manifold. Based on process requirement, sets of process chemical gas (246) are connected to a valve manifold (221). Each chemical gas line has a pressure regulator (222), which control its outflow pressure and a gas flow mass controller (FMC) (223), which control its gas flow rate. There is a gas heater (224) and gas filter (225) is connected into the common gas flow line. The gas heater (224) heats the process gas, and the gas filter (225) blocks possible micro particles from inlet gas. A temperature sensor thermal couple (226) monitors the process gas temperature, and feed back to the system controller. The regulator (247) is used to control the pressure of process nitrogen ($N_2$) supply into the manifold.

There is a container for each process chemical mixture (ex. SC-1). The number of chemicals mixed is process determined. It may optionally be one ($H_2O+O_2$ gas process), may be two ($H_2O_2+H_2O+HF$ gas process), and may be three ($NH_4OH+H_2O_2+H_2O+N_2$ gas process). Each process chemical is brought into the container through its control valve (228) by a metering pump (229) according to its process mix-ratio. A process heater (230) heats up the chemical mixture to a predetermined temperature. The temperature is measured by a thermal couple that is immersed in the chemical. Process nitrogen ($N_2$) flows into the container through its pressure regulator (232) and control valve (248) to agitate the chemical mixture, which facilitates the uniformity of its temperature and chemical characteristic. There is a pressure sensor (234) to monitor the container pressure. A venting valve (235) is provided for venting the container while the container pressure is too high or the agitating is going on.

During the nebulized chemical process, lower pressure nitrogen ($N_2$) (236) at 1–10 PSIG will push the mixture chemicals into the liquid chemical nebulizer (237) through a control valve (238) and a chemical liquid filter (239). At the same time, a higher-pressure process chemical gas said at 10–20 PSIG will flow into the nebulizer (237) through its control valve (240), heater (224), and filter (225). As the lower pressure liquid chemicals said at 1–10 PSIG meet higher-pressure chemical gases at 10–20 PSIG inside the nebulizer (237), they are broken into small particles. Those small particles impact on a round resonator wall (241) of the nebulizer (237) with high velocity, then shattered into smaller particles less than 10 microns. The micro-sized nebulized process chemicals flow into the O-shaped process chamber (111) through a long vertical path (242). A valve (243) is used to control the open and close of the nebulized chemical flow. A valve (244) is used for venting the nebulizer manifold (221). During the process, most of condensed chemical flows back along the vertical flow path (242) by the gravity to a chemical container (249) through a control valve (250) for further reuse or reclaim. A valve (245) mounted at the bottom of the container would be connected to the chemical mixture container (237) or to customer chemical reclaim facility.

Figure 2:
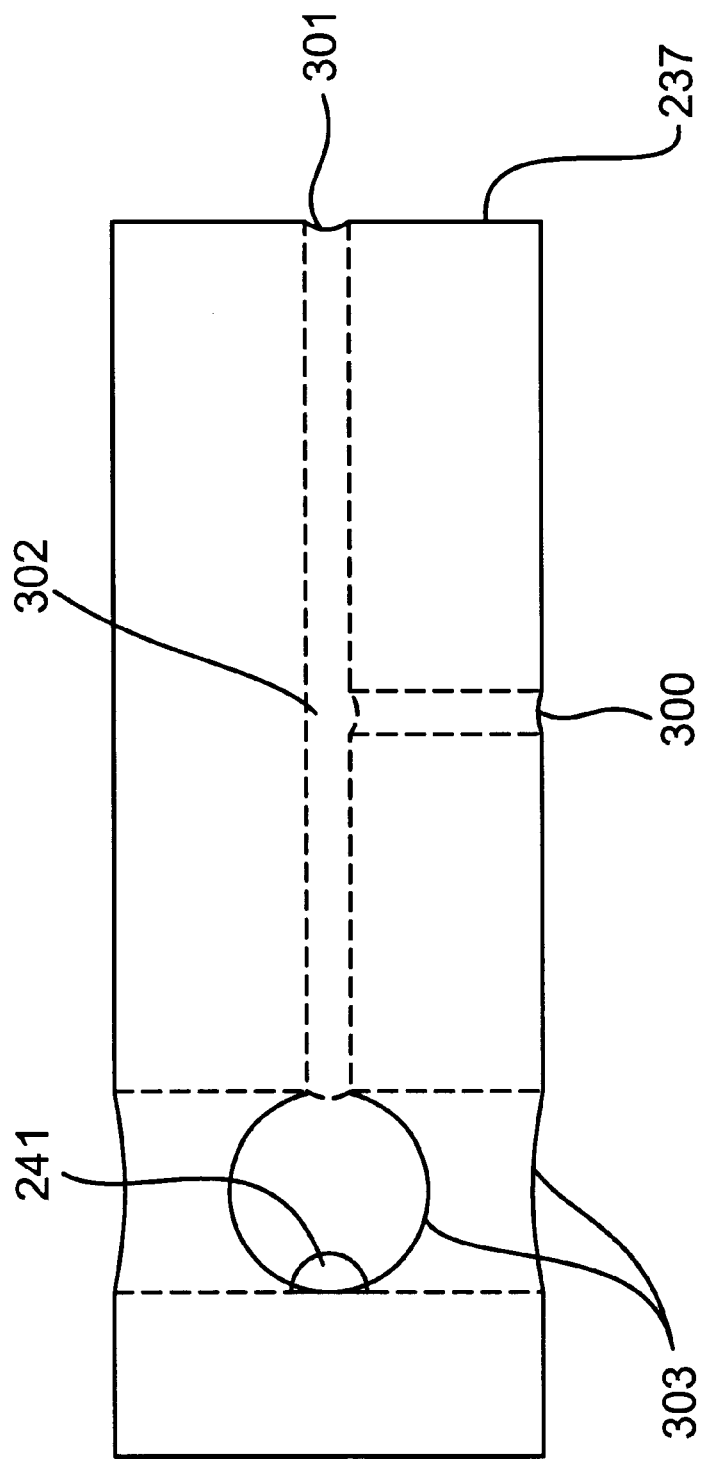
FIG. 2 is the chemical nebulizer design drawing of the present invention.

Referring to FIG. 2 is the chemical nebulizer principle design drawing of the present invention. Based on process recipe, process chemical mixture flow into the device from port (300), and process chemical gas flow into the device from port (301). They meet at the intersection (302) of the nebulizer. The higher-pressure chemical gas breaks the low-pressure chemical mixture into small particles, and impact those small particles on the round resonator wall (241) of the nebulizer with high velocity, then shattered into smaller particles less than 10 microns. The micro-sized nebulized chemical flow out through cross O-shaped openings (303).

The method for wet processing substrates comprises the process determined steps of:

A) Loading (512) substrates into a process chamber;
B) Closing (514) the chamber with a gas tight seal;
C) Flowing (516) hot Nitrogen for temperature conditioning;
D) Introducing (518) a nebulized chemical into the chamber, which generated and carried by a heated chemical gas;
E) Circulating (520) the nebulized chemical inside the chamber;
F) Rinsing (522) substrates with DI water and megsonic energy;
G) Pressuring (524) warm nebulized IPA solvent into the chamber and pushing most of the DI water away from the substrates;
H) Introducing (526) hot nitrogen to completely dry the substrates and chamber;
I) using (528) nebulized chemicals generated by chemical gases to treat substrates;
J) using (530) heated ozone ($O_3$) gas to nebulize the DI water for substrate general particle removal and photo-resistor stripping;
K) first heating (532) hydrofluoric (HF) gas to nebulize the hydrogen peroxide ($H_2O_2$) to prevent particle adhesion to the substrate;
L) second heating (534) the hydrofluoric (HF) gas to nebulize the DI water ($H_2O$) for metallic and native oxide particle removal;
M) third heating (536) positive electrical charged nitrogen ($N_2$) gas to nebulize a platting chemical solution for platting negative electrical charged substrates.
N) fourth heating (538) nitrogen ($N_2$) gas to nebulize heated photo-resistor solution for substrates coating process;
O) generating (540) simple nebulized chemicals to treat substrates at point of use;
P) warming (542) nebulized organic solvent IPA pushing water away from the substrates;
Q) first heating (544) higher viscosity chemicals prior to nebulizing reducing viscosity facilitating nebulization;
R) communicating (546) a chemical gas manifold to at least one process chemical gases input yielding process flexibility;
S) adding (548) a pre-mixed process chemical container containing a pre-determined ratio of chemical mixture by metering pumps;
T) second heating (550) chemical mixture utilizing an immersion heater, and
U) Nitrogen (552) producing temperature and chemical characteristic uniformity in the chemical mixture.

A nebulizer for generating nebulized chemicals by chemical gases. The nebulizer comprising:

A) a body with at least one output port, the body comprises at least one resonator wall; and
B) at least one liquid process chemical input port and at least one process chemical gas input port.

The at least one output port is connected to a flow path functioning to collect condensed chemical during the process. The at least one liquid process chemical input port is connected to liquid chemicals and the at least one process chemical gas input port is connected to a chemical gas. The liquid chemicals are pressurized in a 1 to 10 PSIG range. The chemical gas is pressurized in 10 to 20 PSIG range.

The nebulizer further comprises a process chamber which comprises a cylinder-shaped construction; O-shaped chamber inner wall; process chamber lid section; process chamber carrier section; process chamber bottom section; at least one bank of valve ports for nebulized chemical and DI rinse water and process nitrogen ($N_3$) flow into the chamber; at least one bank of valve ports functioning to chamber vent and drain; at least one meg-sonic transducer energizing during chemical rinse time; and at least one O-ring functioning as a chamber gas tight seal. The O-shaped chamber wall functions to guild the nebulized chemical, gas chemical, and rinse DI water circulating inside the chamber. The O-shaped chamber wall is elliptical shaped to accommodate square substrates. The at least one bank of valve ports for nebulized chemical, rinse DI water and process nitrogen flow into the chamber, at least two valve ports are positioned adjacent to a side of the chamber generating a circular flow pattern inside the process chamber. The at least one meg-sonic transducer, is mounted on the lid of the process chamber generating down stream sonic energy facilitating substrates rinsing. The process chamber carrier section is U-shaped functioning to hold the substrates without any support bar thereunder. The nebulizer is constructed from a material resistant to chemicals and gases. The nebulizer cylinder-shaped body comprises O-shaped output ports. The cylinder-shaped body comprises a round resonator wall. The nebulizer has a flow path that is long and vertical.

Figure 3:
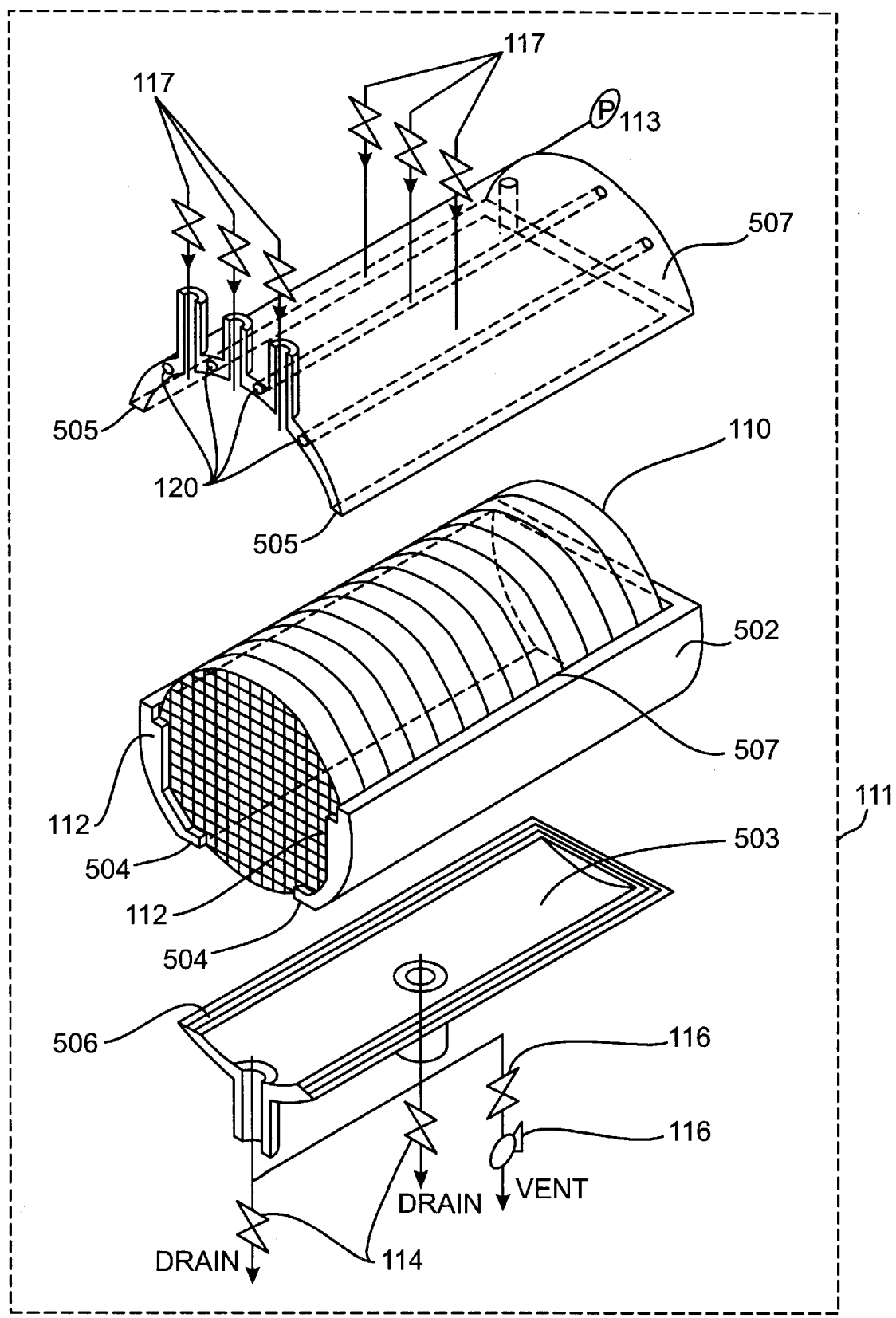
FIG. 3 is the process chamber design drawing of the present invention.

Referring to FIG. 3 which is the principal design drawing of the process chamber in the present invention. An O-shaped process chamber (111) (it would be ellipse-shaped for square substrates), which consist of lid section (501), substrates carrier section (502), and bottom section (503). The substrates (110) (shown wafer in the drawing, and it could be FPD) are sitting on the lower section wall (504) of the carrier section of the process chamber. A set of dividing grooves (112) prevent the substrates align each other. The O-ring (505) and (506) are used to seal the process chamber during an entire process. The process chamber would be made of a material that is well compatible to all process chemicals and gases. The nebulized process chemicals are pressurized into the process chamber through a bank of valve (117), which also serve as rinse DI water and process nitrogen (N$_2$) entry function. The valves of (117), which are located on the side of the process chamber lid would guild the nebulized chemical into a circular flow pattern along the O-shaped wall (507) inside the process chamber. The vacuum pump (116) and the venting valve (115) are connected at the bottom of the process chamber. A bank of drain valve (114) is also located at the bottom of the process chamber.

A couple of meg-sonic transducers (120) are mounted inside the process chamber lid, which will be energized during the process rinse time.

Figure 4:
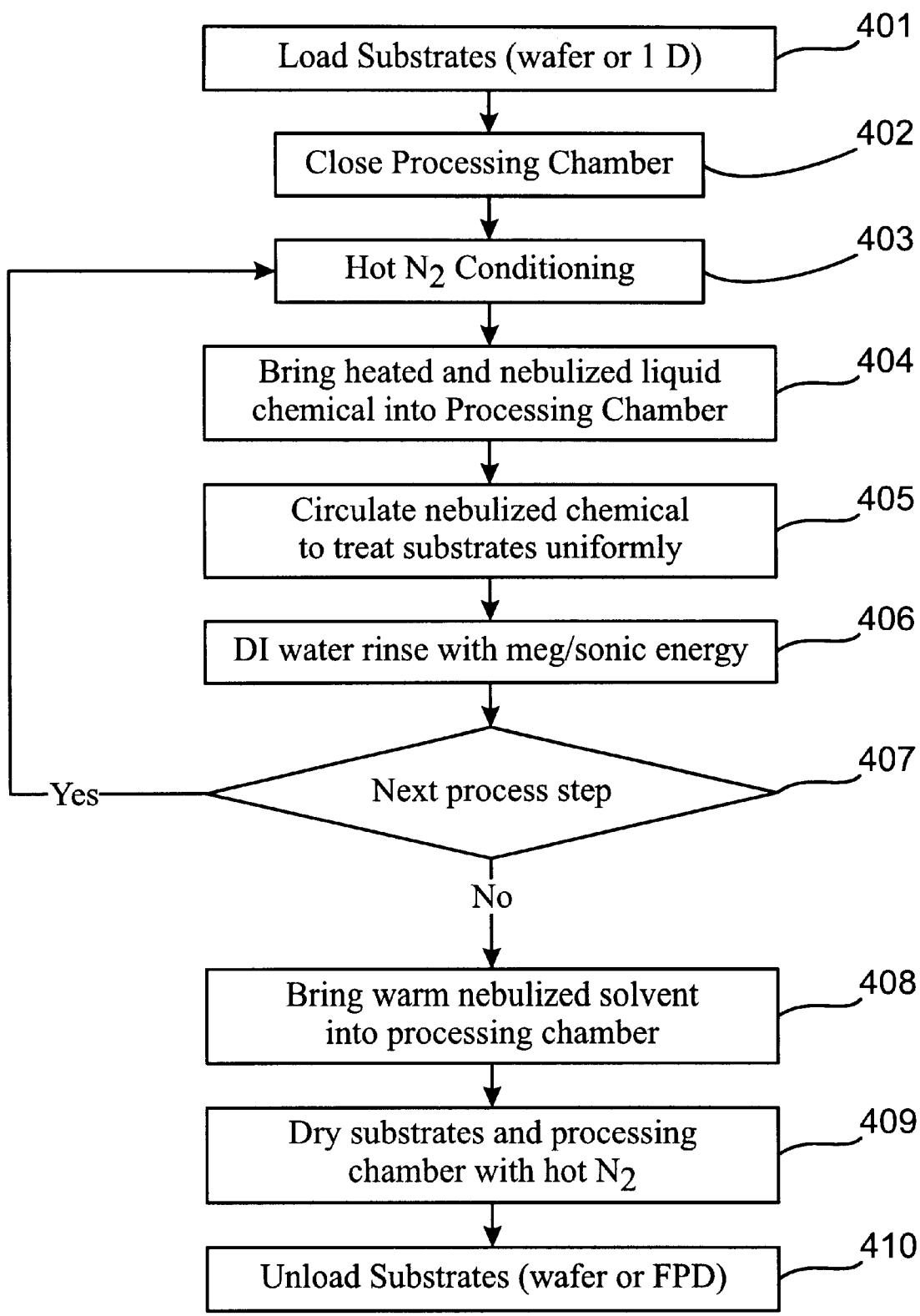
FIG. 4 is the general process flow diagram of the present invention.

Lastly, referring to FIG. 4 is the general process flow diagram of the present invention. In step (401), the substrates to be processed are loaded into the carrier section of the process chamber, and the chamber is sealed at step (402). In step (403), nitrogen (N$_2$) at a pre-set temperature flows into the chamber for substrate temperature conditioning. After the process, chamber and substrates stabilized at the conditioning temperature are heated with nebulized chemical and pressurized into the chamber at step (404). In step (405), the nebulized chemical circulates inside the process chamber along the O-shaped wall of the chamber, and uniformly contact the substrates. After a pre set chemical process time, DI water will flow into the chamber through valves (117) at step (406). The rinse will continue until the rinse water reach the process satisfied conductivity value. At step (407), the system controller determines if there is any further chemical process step set by a process engineer is required. If it is YES, the system repeats the steps above from the step (403). It if is NO, the warm nebulized solvent IPA is pressurized into the process chamber at step (408). The pressurized nebulized IPA forms a thin film on the surface of the rinse DI water, and push most water and some residue particles away from the substrates by its lower surface tension characteristic force. At step (409), the hot nitrogen flows into the chamber, and completely dry all the substrates and the process chamber. Finally, the processed substrates are unloaded at step (410) for next possible process in their product fabrication.

It will be understood that each of the elements described above, or two or more together, may also find a useful application in other types of constructions differing from the type described above.

While the invention has been illustrated and described as embodied in a nebulizer, it is not intended to be limited to the details shown, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. A nebulizer for generating nebulized chemicals by chemical gases, the nebulizer comprising:

A) a body with at least one output port, the body comprises at least one resonator wall, B) at least one liquid process chemical input port and at least one process chemical gas input port, C) a process chamber comprising a cylinder-shaped construction, O-shaped chamber inner wall, process chamber lid section, process chamber carrier section, process chamber bottom section, at least one bank of valve ports for nebulized chemical and DI rinse water and process nitrogen (N$_2$) flow into the chamber, at least one bank of valve ports functioning to chamber vent and drain, at least one meg-sonic transducer energizing during chemical rinse time and at least one O-ring functioning as a chamber gas tight seal.

2. The nebulizer as described in claim 1 wherein the O-shaped chamber wall functions to guide the nebulized chemical, gas chemical and rinse DI water circulating inside the chamber.

* * * * *